United States Patent
Herrmann et al.

(10) Patent No.: US 9,835,303 B2
(45) Date of Patent: Dec. 5, 2017

(54) OPTOELECTRONIC COMPONENT AND METHOD FOR THE PRODUCTION THEREOF

(71) Applicant: OSRAM Opto Semiconductors GmbH, Regensburg (DE)

(72) Inventors: Siegfried Herrmann, Neukirchen (DE); Walter Wegleiter, Nittendorf (DE); Andreas Plößl, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 195 days.

(21) Appl. No.: 14/654,538

(22) PCT Filed: Dec. 17, 2013

(86) PCT No.: PCT/EP2013/076943
§ 371 (c)(1),
(2) Date: Jun. 21, 2015

(87) PCT Pub. No.: WO2014/095895
PCT Pub. Date: Jun. 26, 2014

(65) Prior Publication Data
US 2015/0345727 A1    Dec. 3, 2015

(30) Foreign Application Priority Data

Dec. 21, 2012    (DE) .................. 10 2012 112 988

(51) Int. Cl.
*F21S 8/10*    (2006.01)
*H05K 3/32*    (2006.01)
(Continued)

(52) U.S. Cl.
CPC ......... *F21S 48/1109* (2013.01); *F21S 48/115* (2013.01); *F21S 48/212* (2013.01);
(Continued)

(58) Field of Classification Search
None
See application file for complete search history.

(56) References Cited

U.S. PATENT DOCUMENTS

| 7,265,392 B2 | 9/2007 | Hahn et al. |
| 8,102,060 B2 | 1/2012 | Plössl et al. |

(Continued)

FOREIGN PATENT DOCUMENTS

| DE | 102006004406 A1 | 9/2006 |
| DE | 102006028692 A1 | 11/2007 |

(Continued)

*Primary Examiner* — Kristy A Haupt
(74) *Attorney, Agent, or Firm* — Slater Matsil, LLP (57) ABSTRACT

An optoelectronic device and a method for producing an optoelectronic device are disclosed. An embodiment of an optoelectronic device includes a carrier, an electrically conductive layer arranged on the carrier, at least one semiconductor chip comprising an active layer for generating electromagnetic radiation, wherein the semiconductor chip is electrically conductively and mechanically connected with the carrier via the electrically conductive layer. The device further comprises a holder, wherein a surface of the carrier remote from the semiconductor chip is arranged on the holder, wherein the carrier is mechanically connected with the holder by at least one fastening element and is fastened to the holder, wherein the fastening element passes completely through the carrier, and wherein the semiconductor chip is electrically conductively connected to the holder by the fastening element.

21 Claims, 4 Drawing Sheets

(51) Int. Cl.
*H01L 25/075* (2006.01)
*H01L 33/00* (2010.01)
*H01L 33/48* (2010.01)
*H01L 33/62* (2010.01)

(52) U.S. Cl.
CPC ........ *F21S 48/215* (2013.01); *H01L 25/0753* (2013.01); *H01L 33/0079* (2013.01); *H01L 33/486* (2013.01); *H01L 33/62* (2013.01); *H05K 3/32* (2013.01); *H01L 2924/0002* (2013.01); *H01L 2933/0033* (2013.01); *H01L 2933/0066* (2013.01); *H05K 3/325* (2013.01); *H05K 2201/1034* (2013.01); *H05K 2201/10106* (2013.01); *H05K 2201/10409* (2013.01); *H05K 2201/10924* (2013.01); *Y10T 29/49131* (2015.01)

(56) References Cited

U.S. PATENT DOCUMENTS

| 8,890,306 | B2 | 11/2014 | Reill et al. |
| 2006/0169991 | A1 | 8/2006 | Kikuchi |
| 2010/0044745 | A1 | 2/2010 | Sakai et al. |
| 2011/0175548 | A1* | 7/2011 | Nishimura ................ F21K 9/00 315/294 |
| 2012/0106184 | A1* | 5/2012 | Kishimoto ........... B60Q 1/0011 362/510 |
| 2012/0299747 | A1 | 11/2012 | Schubert et al. |
| 2013/0135883 | A1 | 5/2013 | Singer et al. |
| 2013/0207133 | A1 | 8/2013 | Reill et al. |
| 2013/0207155 | A1 | 8/2013 | Herrmann |
| 2014/0203253 | A1 | 7/2014 | Goeoetz et al. |

FOREIGN PATENT DOCUMENTS

| DE | 102009009609 A1 | 9/2010 |
| DE | 102009053064 A1 | 5/2011 |
| DE | 102010026344 A1 | 1/2012 |
| DE | 102011077687 A1 | 12/2012 |
| EP | 2346307 A2 | 7/2011 |
| WO | 2012004049 A1 | 1/2012 |
| WO | 2012013500 A1 | 2/2012 |
| WO | 2012016760 A1 | 2/2012 |
| WO | 2012023611 A1 | 2/2012 |

* cited by examiner

OPTOELECTRONIC COMPONENT AND METHOD FOR THE PRODUCTION THEREOF

This patent application is a national phase filing under section 371 of PCT/EP2013/076943, filed Dec. 17, 2013, which claims the priority of German patent application 10 2012 112 988.6, filed Dec. 21, 2012, each of which is incorporated herein by reference in its entirety.

TECHNICAL FIELD

An optoelectronic device is provided. A method for the production of an optoelectronic device is furthermore provided. In addition, a headlamp with an optoelectronic device is provided.

BACKGROUND

International Application Publication No. WO 2012/013500 describes an optoelectronic device.

SUMMARY OF THE INVENTION

Embodiments of the invention provide an optoelectronic device which is of particularly simple construction and is cost-effective. Other embodiments provide a method for producing a reliable, cost-effective and simple optoelectronic device. Further embodiments provide a cost-effective and efficient headlamp.

According to one aspect, an optoelectronic device, device for short, is provided. The device comprises a carrier. The carrier is suitable as a mechanical support for an optoelectronic structure, for example, for a light-emitting diode (LED).

The carrier comprises, for example, silicon, a silicon nitride ($Si_3N_4$) and/or an aluminum nitride (AlN) ceramic. The carrier may however also comprise zinc oxide (ZnO), boron nitride (BN), boron carbide ($B_4C$), aluminum oxide ($Al_2O_3$) or aluminum oxide reinforced with zirconium oxide ($ZrO_2$). The carrier may in this case contain at least one of the stated materials or consist of one of the materials.

The carrier preferably has a high mechanical robustness. Additionally or alternatively, the carrier preferably has a high thermal conductivity. $Si_3N_4$ is particularly suitable in this respect as a material for the carrier, since it has a very high thermal conductivity of around 90 to 110 W/mK, for example, 100 W/mK. Furthermore, $Si_3N_4$ has a high mechanical robustness. Furthermore, the coefficient of thermal expansion of $Si_3N_4$ is only very low. For example, a carrier with $Si_3N_4$ has a coefficient of thermal expansion of approximately $3.2 \cdot 10^{-6}$/K. Preferably, the coefficient of thermal expansion of the carrier is roughly as great as the coefficient of thermal expansion of a semiconductor material of the optoelectronic structure.

The carrier is, for example, constructed as a disc. In particular, the extent of the carrier in the lateral direction is greater than the extent thereof in the vertical direction perpendicular thereto. In this context, "lateral direction" means a direction parallel to the main direction of extension or to the main plane of extension of the carrier. "Vertical direction" is a direction perpendicular to the main direction of extension or to the main plane of extension of the carrier, i.e., for example, the thickness or height of the carrier. The carrier has a small thickness. The thickness of the carrier is preferably between approximately 700 µm and approximately 50 µm. For example, the carrier has a thickness of between 500 µm and 150 µm. Particularly preferably, the thickness of the carrier is between 200 µm and 300 µm, for example, 220 µm, 230 µm, 250 µm or 270 µm.

An electrically conductive layer is arranged on the carrier. In particular, the electrically conductive layer is arranged at least in sub-regions of the carrier. The electrically conductive layer is, for example, a metal layer. The electrically conductive layer serves for contacting the previously mentioned optoelectronic structure.

The device further comprises at least one optoelectronic structure, in particular a semiconductor chip, preferably two, three or more, for example, ten or 100 semiconductor chips. The semiconductor chip comprises an active layer for generating electromagnetic radiation, for example, light.

The semiconductor chip is preferably a light-emitting diode, particularly preferably a flip-chip LED. In a flip-chip LED electrical contacting of the semiconductor chip is in particular unilateral. In this way, the radiation outcoupling face of the semiconductor chip is free of contact structures. On the radiation outcoupling side of the semiconductor chip no absorbing contact structures or current spreading layers are therefore arranged by which the light emitted by the semiconductor chip could be at least partly absorbed. Absorption losses at such contact layers or current spreading layers arranged on the radiation outcoupling face are thus avoided, so increasing the light emission of the device.

The semiconductor chip preferably is a substrateless LED chip. This means a growth substrate, on which semiconductor layers of the LED chip are grown epitaxially, has been removed from the epitaxially grown layers. The semiconductor chip therefore consists of its epitaxially grown semiconductor layers and optionally of metallized coatings and/or insulation layers, which are applied, for example, to an outer surface of the semiconductor body formed by the epitaxially grown semiconductor layers. The substrateless semiconductor chip is distinguished inter alia by its small thickness. The substrateless semiconductor chip preferably has a thickness of less than 10 µm, preferably less than 7 µm, for example, 6 µm.

The layer stack of the semiconductor chip preferably contains a III/V semiconductor material. III/V-semiconductor materials are particularly suitable for generating radiation in the ultraviolet, through the visible to the infrared spectral range.

The semiconductor chip is applied to the carrier and in particular to the electrically conductive layer. The semiconductor chip is preferably soldered in planar manner to the electrically conductive layer or at least to sub-regions of the electrically conductive layer. The semiconductor chip is connected to the carrier mechanically and electrically conductively via the electrically conductive layer.

The carrier may further comprise a protection diode or a protection diode structure. The semiconductor chip is protected from electrostatic discharge by means of the protection diode structure. An electrical voltage, arising, for example, as a result of electrostatic charging and applied in the non-conducting direction relative to the conducting direction of the active region of the semiconductor chip, may flow away via the protection diode structure. Damage to the semiconductor chip is thus avoided.

As protection from electrostatic discharge it is possible, for example, to use a Zener diode, or indeed a luminescent diode, which are connected antiparallel to the light-emitting diode to be protected. With a Zener diode the current/voltage characteristic of the protection diode structure in the conducting direction of the active region of the device (semiconductor chip) to be protected has a threshold value. The term "threshold value" is here understood to mean the Zener voltage acting in the non-conducting direction of the Zener diode. In the case of a voltage of a lower magnitude than the threshold value, there is no or at least no significant current flow through the protection diode structure. The threshold value preferably amounts to at least 1 V, particularly preferably at least 2 V. The protection diode is electrically insulated from the carrier. The protection diode may, for example, be introduced into an electrically insulated, vertically separate opening in the carrier.

The device further comprises a holder. The holder comprises a metal, for example, copper (Cu). Alternatively or in addition, the holder may comprise aluminum, an aluminum alloy or a thermally conductive plastics material. The holder serves as a heat sink for the device. In particular, the holder serves to output heat generated by the semiconductor chip to the surrounding environment. A surface of the carrier remote from the semiconductor chip is arranged on the holder. A surface of the holder facing the carrier may be of convex construction, to improve thermal coupling to the carrier through slight pretension.

The carrier is fastened, preferably permanently fastened, to the holder. In particular, the carrier is connected mechanically to the holder by at least one fastening element, preferably two fastening elements.

The fastening element passes completely through the carrier in a vertical direction. In particular, the fastening element extends from a surface of the carrier facing the semiconductor chip through the carrier as far as the surface of the carrier remote from the semiconductor chip. The semiconductor chip is electrically conductively connected to contact terminals in the holder by the fastening element, i.e., contacted.

Through contacting of the semiconductor chip by means of the fastening element, wire-contacting or wire bonding or solder-contacting of the semiconductor chip may be dispensed with. The device is accordingly of particularly simple construction and comprises only a small number of components. A particularly cost-effective and simple device is thus provided.

Because the carrier has only a small thickness and very good thermal conductivity, the device comprises optimal thermal coupling to the holder. This increases the service life and reliability of the device.

According to at least one embodiment of the optoelectronic device, connection proceeds between spatially insulated contact regions of the same polarity of the device solely at the surface of the carrier facing the semiconductor chip. In particular, connection proceeds between the spatially insulated contact regions of the same polarity via the electrically conductive layer at the surface of the carrier, i.e., in the region between the carrier and the semiconductor chip.

An additional rewiring layer arranged, for example, inside the carrier or between carrier and holder may thus be dispensed with and the number of components of the device may be reduced.

To connect spatially insulated regions of different polarities, it is under certain circumstances necessary to provide an insulation layer on the carrier, to prevent short-circuiting. An example thereof is an anode contact (p) surrounded annularly by the cathode(s), where an insulation layer prevents short circuiting (and in the process entails differences in height). In the case of "substrateless" LED chips, the anode contact surrounded annularly by the cathode has proven particularly advantageous, because in this way, when an epitaxial substrate is detached, for example, by laser lift-off, it is possible reliably to prevent cracks in the region of an insulation gap between the electrodes in which the epitaxial layer is not supported by a link to the carrier.

In principle, however, an arrangement of electrodes is also possible which allows contact access from one edge of the device for both polarities (i.e., without one contact being enclosed by the other). In the same way, a flip-chip may also comprise an electrode structure in which one polarity completely encloses the other, in which case an insulation layer thus becomes necessary on the carrier to prevent short circuits. It is not, on the other hand, necessary to provide an additional insulation layer if each polarity may be picked off at an outer circumference of the device.

According to at least one embodiment of the optoelectronic device, the device comprises two or more fastening elements. The respective fastening element may comprise the same material as the electrically conductive layer. The respective fastening element may consist of a metal or comprise at least one metal. Preferably, the fastening element comprises a highly conductive metal such as brass, steel, copper, gold, silver and/or aluminum. These materials are also distinguished by high thermal conductivity. The fastening element may also comprise a plastics material. The plastics material may be encased by a metal, preferably one of the above-stated metals.

The fastening element may comprise an insulation, for example, a plastics coating, at least in a sub-region. The respective fastening element is preferably of pin-shaped construction. The respective fastening element may comprise a screw, a nail, a retaining pin or a rivet.

The carrier further comprises two or more openings. The openings pass completely through the carrier in a vertical direction. The openings may, for example, be of slot-like construction. For example, the openings may each be formed in an edge region of the carrier. The openings may open towards the edge of the carrier. In other words, the respective opening may take the form of a slot-like indentation or notch at the edge of the carrier, wherein the respective opening passes completely through the carrier in the vertical direction.

The openings are spaced laterally from one another. The openings in the carrier are moreover laterally spaced from a mounting region of the semiconductor chip. The openings are electrically insulated from one another. The openings are produced, for example, by laser radiation, punching, drilling or etching of the carrier. The openings are suitable and configured such that the above-described fastening elements may be guided at least partly into and through the openings.

The respective fastening element is introduced at least partly into the respective opening. The respective fastening element may be introduced from the surface of the carrier facing the semiconductor chip into the opening.

Alternatively, the respective fastening element may also be introduced from the surface of the carrier remote from the semiconductor chip into the opening. In this case, the fastening element is preferably a threaded rod and is fixed on the carrier from the side of the carrier facing the semiconductor chip, for example, with the assistance of a nut. Alternatively, the fastening element may also be introduced from an edge of the carrier, i.e., from a horizontal direction, into the respective opening. In this case the opening, as explained above, is preferably of slot-shaped configuration or constitutes an orifice/indentation/slot at the edge of the carrier.

Alternatively, the opening may comprise a first and a second region, wherein the first region has a larger diameter than the second region. The first region constitutes an orifice region of the opening. In particular, the respective fastening element is introduced from the first region further into the opening and in particular into the second region. The fastening element may then be fixed in place by means of the second region by a rotational motion, similar to a bayonet closure. In this embodiment, the respective fastening element preferably takes the form of a retaining pin.

The respective fastening element completely fills the vertical extent of the opening. The carrier is fastened to the holder by means of the fastening element and of the opening. For simplified fastening, the opening may also comprise a screw thread.

The semiconductor chip is electrically contactable via the openings from the side of the carrier remote from the semiconductor chip. Contacting of the semiconductor chip by means of wires is thus redundant. The device is consequently of particularly simple construction. By using a screw, a nail or a rivet as fastening element, recourse is additionally made to particularly simple or easily producible components, such that an cost-effective and simple device is provided.

According to at least one embodiment of the optoelectronic device, the fastening element comprises a first and a second end region. The first end region of the fastening element, for example, a head end of the screw, the rivet or the nail, projects from the carrier at a surface of the carrier remote from the holder. The first end region may comprise the above-mentioned insulation, for example, a plastics cap. The second end region of the fastening element, for example, a blunt or pointed end of the screw, the rivet or the nail, projects out of the carrier at a surface of the carrier facing the holder. The second end region of the fastening element passes at least partly through the holder. Thus, a secure mechanical connection between the carrier and the holder is produced by means of the fastening element.

According to at least one embodiment of the optoelectronic device, the holder comprises at least one n-side contact region, at least one p-side contact region and a main body. The contact regions are spaced laterally from one another. The contact regions are electrically insulated from the main body and from one another. The second end region of the fastening element is connected electrically conductively to the respective contact region. In particular, the end region of a first fastening element is connected to the n-side contact region and the end region of a second fastening element is connected to the p-side contact region.

The electrically conductive layer comprises an n-conductive region, which is connected to the n-side contact region via the fastening element. Furthermore, the electrically conductive layer comprises a p-conductive region, which is connected to the p-side contact region via a further fastening element. The n-conductive region is of annular construction. The n-conductive region and the p-conductive region of the electrically conductive layer are electrically insulated from one another.

The semiconductor chip is connected electrically on the p-side via the p-conductive region, which is connected electrically conductively with the p-side contact region of the holder by means of one of the fastening elements. The semiconductor chip is connected on the n-side via the n-conductive region, which is connected electrically conductively with the n-side contact region of the holder by means of a further one of the fastening elements. Thus, reliable electrical contacting of the semiconductor chip is simply achieved.

According to a further aspect, a method is described for producing an optoelectronic device. The resultant device preferably corresponds to the above-described device. All the features disclosed for the optoelectronic device are also disclosed for the method and vice versa.

In a first step, the above-described carrier is provided. The carrier, for example, comprises a silicon nitride ceramic or an aluminum nitride ceramic. The carrier comprises a mechanically robust carrier, on the outer faces of which semiconductor chips may be arranged and fastened. In other words, the carrier is self-supporting and constitutes a robust mounting and/or carrier base for a semiconductor chip.

In a further step, the openings are formed in the carrier, for example, by means of laser radiation, drilling, punching and/or etching. Alternatively, the openings may be formed when the carrier is still in the green state, prior to firing of the carrier.

The carrier preferably comprises two openings. However, a larger number of openings is also conceivable. The respective opening is formed in such a way that a diameter of the respective opening is greater than or equal to a diameter of the region of the fastening element which is to be introduced into the opening. Preferably, the diameter of the respective opening is smaller than a diameter of the above-described first end region of the fastening element. Introduction of the first end region into the opening is thus prevented. Preferably, the diameter of the respective opening is greater than or equal to a diameter of the above-described second end region of the fastening element. Thus, the second end region may be passed fully through the opening.

In a further step, the electrically conductive layer is formed on the carrier. For example, the carrier is coated with the electrically conductive layer.

In a further step, the at least one semiconductor chip is arranged on the carrier. In particular, the semiconductor chip is connected electrically conductively with the electrically conductive layer on the carrier. The semiconductor chip is connected electrically conductively and mechanically to the electrically conductive layer, and thus to the carrier, for example, by means of a solder material. The solder material may, for example, comprise gold (Au) and/or tin (Sn). Preferably, in this step a multiplicity of semiconductor chips, for example, five, 50 or 100 semiconductor chips, are arranged on the carrier and connected electrically conductively therewith. Solder material may in this respect be located on the semiconductor chip itself or on a "bonding" or contact region (bond pad) of the electrically conductive layer. Alternatively, the semiconductor chip may also be connected to the carrier by means of thermocompression, gold-gold friction welding, adhesive bonding with an anisotropically conductive adhesive, low-temperature joining by sintering of silver powders or isothermal solidification ("liquid phase bonding"), for example, with copper-tin (Cu—Sn). Silver sintering in particular, but also isothermal solidification, allow a thermally very good bond between semiconductor chip and carrier.

The semiconductor chip is arranged in such a way on the carrier or the electrically conductive layer that it is spaced from the openings in the carrier. When the carrier is viewed in plan view, the semiconductor chip may, for example, be arranged in a region between the openings.

In a further step, the carrier is arranged on the holder. The carrier is preferably arranged in such a way on the holder that the openings, when viewed in plan view onto the carrier, are arranged over the contact regions of the holder.

In a further step, the fastening elements are provided. The fastening elements may comprise screws, retaining pins, nails or rivets. The number of fastening elements provided preferably corresponds with the number of openings in the carrier. Preferably, two fastening elements are provided. Alternatively, the number of fastening elements provided may also be less than the number of openings, for example, if an additional opening is provided for provision of a protection diode in the carrier.

In a further step, the carrier is fastened to the holder with the fastening elements to connect the carrier mechanically with the holder and for electrical contacting of the semiconductor chip. The fastening elements are guided through the openings to fasten the carrier in place. This means that the fastening elements simultaneously bring about mechanical fastening and electrical contacting.

For example, the second end region of the respective fastening element is initially introduced into and through the opening, such that the second end region projects out of the carrier again at the surface of the carrier remote from the semiconductor chip. The second end region serves to connect the respective contact region of the holder electrically conductively with the respective conductive region of the carrier. The second end region preferably projects, to this end, into the respective contact region of the holder once it has been passed through the opening.

The first end region of the fastening element has a size and in particular a diameter which is greater than the diameter of the opening. The first end region is therefore not introduced into the opening. The first end region serves to secure the fastening element against further movement with regard to the holder and the carrier, as soon as a surface of the first end region is in mechanical contact with the surface of the carrier which faces the semiconductor chip. In particular, the first end region prevents the fastening element from slipping completely through the carrier.

By means of the fastening element, electrical contacting of the semiconductor chip is simply achieved. Wires or further components for electrical contacting of the semiconductor chip are superfluous. It is thus possible to produce a reliable and cost-effective device in a simple way.

According to at least one embodiment, in a further step a growth substrate is removed from a surface of the semiconductor chip remote from the carrier. The growth substrate serves in mechanical stabilization of the semiconductor chip until the semiconductor chip is fastened to the carrier. After fastening, mechanical stabilization of the semiconductor chip is no longer necessary due to the solid structure of the carrier, such that the growth substrate may be removed. Removal of the growth substrate may proceed, for example, mechanically, for instance by means of grinding, lapping or polishing, and/or chemically, for example, by means of wet chemical or dry chemical etching and/or by means of coherent radiation, in particular laser radiation. Likewise, removal of the growth substrate may proceed by means of incoherent radiation of sufficient intensity.

In a further step, the surface of the semiconductor chip which is remote from the carrier may be roughened or patterned. This proceeds, for example, by means of etching, brushing, grinding or (sand) blasting. This increases semiconductor chip emission.

According to a further aspect, a method is described for the production of an optoelectronic device, preferably the above-described optoelectronic device. The device is produced using the above-described method.

According to a further aspect, a headlamp is described. The headlamp is suitable, for example, for use as a front headlamp in a vehicle. However, other uses for the headlamp are also possible, for example, in floodlight systems or head torches.

The headlamp comprises an optoelectronic device. Preferably, the headlamp comprises the above-described optoelectronic device. In particular, the device is preferably produced using the above-described method. Furthermore, the headlamp comprises an optical element. The optical element may, for example, be provided for concentration or scattering of the radiation emitted by the semiconductor chip.

For example, the optical element comprises a lens. The optical element may also comprise a conversion element. The conversion element is configured to convert the radiation emitted by the semiconductor chip partially or completely into further radiation with a wavelength different from the emitted radiation. For example, a semiconductor chip emitting in the blue range of the spectrum and a conversion element with a mixture of converter materials emitting in the green and red ranges may be used to provide a white-emitting semiconductor device. Alternatively, the conversion element may be used to generate longer wave, approximately monochromatic light by means of a semiconductor chip emitting in the blue range. The optical element is arranged downstream of the device in an emission direction.

Use of the above-described device in the headlamp may provide a particularly cost-effective headlamp which comprises only a small number of components and therefore is of particularly simple construction and not very susceptible to failure.

BRIEF DESCRIPTION OF THE DRAWINGS

The optoelectronic device and the method are explained in greater detail below with reference to exemplary embodiments and the associated figures.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 1:
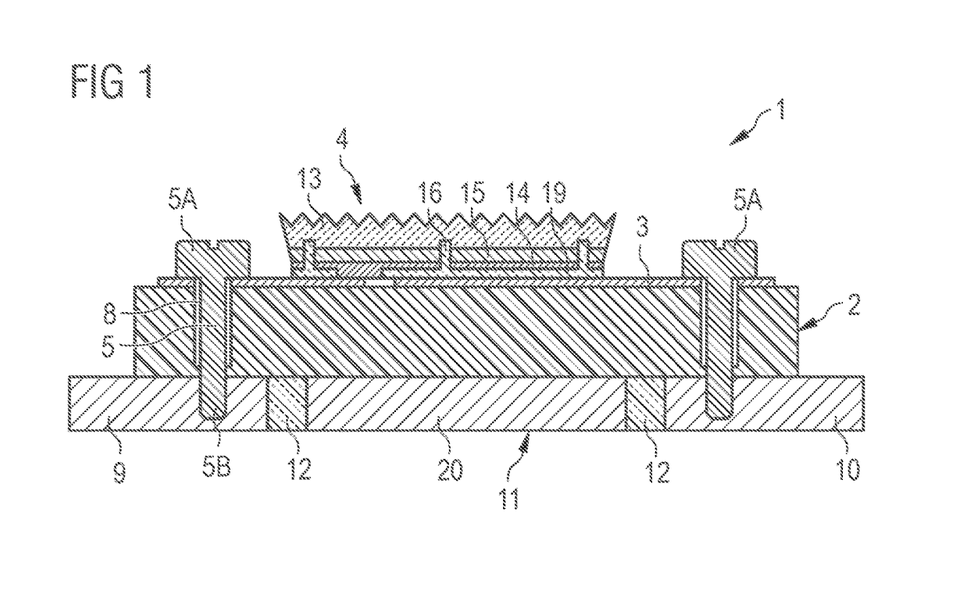
FIG. 1 shows a side view of an optoelectronic device.
Figure 7A:
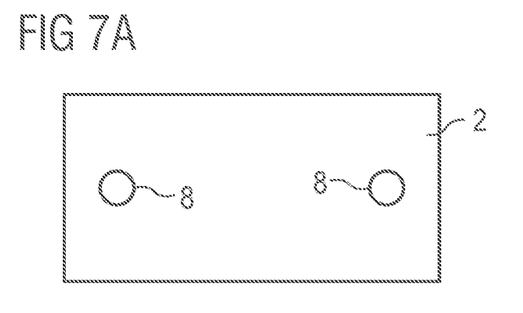
FIGS. 7A, 7B and 7C show a plan view onto the carrier.
Figure 7B:
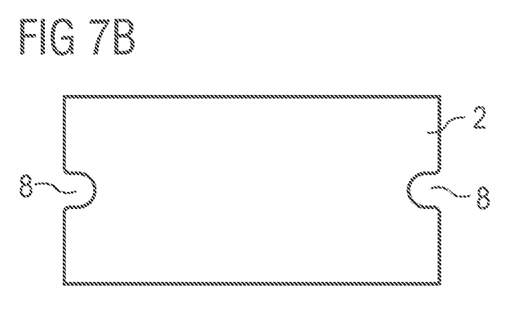
Figure 7C:
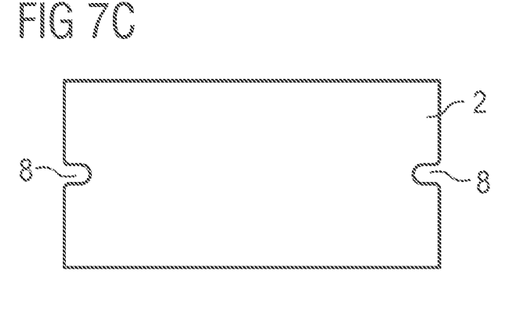

FIG. 1 shows an optoelectronic device 1, or device 1 for short. The device 1 comprises a carrier 2. The carrier 2 comprises two openings 8, for example, bores. The openings 8 are spaced laterally from one another (see in this respect, for example, FIGS. 7A to 7C) and pass completely through the carrier 2. In particular, the openings 8 extend completely through the carrier 2 in a vertical direction perpendicular to the main direction of extension of the carrier 2. The openings 8 may take the form of recesses or notches or of slots in an edge region of the carrier 2, as is apparent from FIGS. 7B and 7C. The openings 8 are insulated electrically from one another.

The carrier 2 may further comprise an ESD protection diode, for example, a luminescent or Zener diode (not shown explicitly). The protection diode may be introduced into a further, separate opening 8 in the carrier 2 (not shown explicitly). Consequently, the carrier 2 may also comprise three or more openings 8.

Figure 2:
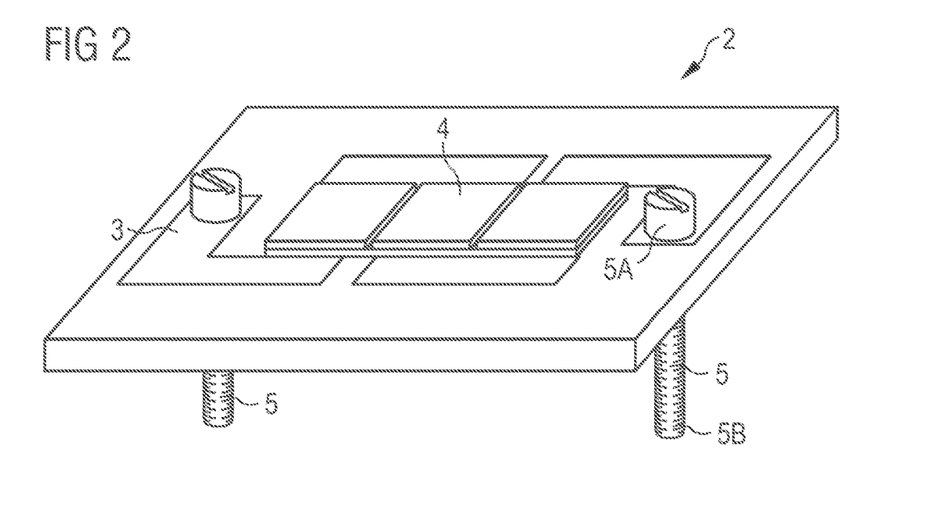
FIG. 2 shows a perspective view of part of the device from FIG. 1.

The device 1 further comprises an electrically conductive layer 3, for example, a metal layer. The electrically conductive layer 3 is arranged at least on a region of the surface of the carrier 2. The electrically conductive layer 3 may extend over the entire surface of the carrier 2. Alternatively, however, the electrically conductive layer 3 may also extend only over sub-regions of the surface of the carrier 2 (see FIGS. 2 to 4). The electrically conductive layer 3 then leads from the openings 8 into a middle region of the carrier 2, on which a semiconductor chip 4 is arranged (see in particular FIGS. 2 and 6).

In FIG. 1 a semiconductor chip 4 is arranged and fastened on the electrically conductive layer 3, for example, via a solder or bonding means layer 19. Alternatively, however, more than one semiconductor chip 4 may also be arranged on the electrically conductive layer 3, for example, three, ten, or 50 semiconductor chips 4 (see FIGS. 2, 4 and 6). The semiconductor chip 4 is arranged between the openings 8 in the carrier 2. In particular, the semiconductor chips 4 and the openings 8 do not overlap.

The semiconductor chip 4 comprises a semiconductor layer sequence, which is based, for example, on a III/V compound semiconductor material. The semiconductor layer sequence comprises a p-layer 14, an n-layer 13 and an active layer 15 arranged therebetween. A growth substrate for the semiconductor layer sequence has been completely removed.

The semiconductor chip 4 is connected electrically conductively and mechanically with the carrier 2 or the electrically conductive layer 3 by means of the bonding means layer 19. The bonding means layer 19 contains, for example, a solder material such as for instance gold and/or tin. The bonding means layer 19 is in electrically conductive contact in places with the electrically conductive layer 3. In other regions a passivation layer (not shown explicitly) may be arranged between the bonding means layer 19 and the electrically conductive layer 3. The passivation layer is electrically insulating. The passivation layer is formed from an insulating material, for example, aluminum nitride (AlN), aluminum oxide ($Al_2O_3$), silicon nitride ($Si_3N_4$) and/or silicon dioxide ($SiO_2$). The passivation layer may, for example, be produced by the sintering together of powder or using physical or chemical vapor deposition methods.

The bonding means layer 19 comprises an n-region (not shown explicitly) which is connected electrically conductively with the n-layer 13 of the semiconductor layer sequence. The bonding means layer 19 further comprises a p-region (not shown explicitly) which is connected electrically conductively with the p-layer 14 of the semiconductor layer sequence. The bonding means layer may be produced, for example, by means of an electrically insulating adhesive, which allows mechanical cohesion but is pierced at a sufficiently large number of points by surface asperities of the metallic surfaces of the joined parts (electrically conductive layer 3 and p-layer 14), where the metal-metal connection ensures electrical connection. In this regard, reference is made to German application DE 10 2006 028692 A1, the disclosure content of which is hereby included by reference.

On the side of the semiconductor chip 4 facing the carrier 2, a mirror layer is arranged which may consist of two or more layers (not shown explicitly). Alternatively, the mirror layer may also comprise just one layer. The mirror layer is in this case applied to the p-layer 14 and serves in p-side contacting of the semiconductor layer sequence. The mirror layer is provided to reflect electromagnetic radiation generated in the active layer 15 of the semiconductor chip 4. The mirror layer is, for example, mounted on the p-layer 14 of the semiconductor layer sequence and connected mechanically thereto. Electric current for operating the active layer 15 may in this case also be impressed via the mirror layer into the p-layer 14 of the semiconductor layer sequence, provided the mirror layer is electrically conductive. For example, the mirror layer contains a reflective material such as gold or silver.

For n-side contacting of the n-layer 13 of the semiconductor layer sequence, the semiconductor chip 4 comprises through-vias. The through-vias are formed by an opening 16 in the semiconductor layer sequence of the semiconductor chip 4. The through-vias extend through the mirror layer, the p-layer 14 and the active layer 15 as far as the n-layer 13. The through-vias are filled, for example, with material of the bonding means layer 19 and contact the semiconductor layer sequence at an n-conductive region 6 of the electrically conductive layer 3 (see, for example, FIGS. 3 and 4), as described in detail further below.

The device 1 further comprises a holder 11. The holder 11 comprises a metal, for example, copper. The holder 11 may be of multipart or one-piece construction. According to the embodiments shown in FIGS. 1, 5 and 6, the holder 11 is formed of three separate elements. The holder 11 comprises a main body 20. The holder 11 further comprises an n-side contact region 10 and a p-side contact region 9.

In this exemplary embodiment the contact regions 9, 10 are arranged on a surface of the holder 11 facing the carrier 2. In an alternative exemplary embodiment (see FIG. 6) the contact regions 9, 10 may however also be arranged on a surface of the holder 11 remote from the carrier 2. In this exemplary embodiment the contact regions 9, 10 and the main body 20 have the same vertical extent. In particular, the contact regions 9, 10 extend over the entire vertical extent of the holder 11. The contact regions 9, 10 are electrically insulated from one another and from the main body 20 by means of an insulation 12. The contact regions 9, 10 are formed, for example, with highly conductive metals such as gold, silver and/or aluminum.

The carrier 2 is arranged with its surface remote from the semiconductor chip 4 on the holder 11. The carrier 2 is fastened mechanically, for example, screwed, nailed or riveted, to the holder 11. For this purpose, the device 1 comprises two fastening elements 5, for example, screws, nails, retaining pins or rivets. The fastening elements 5 are electrically conductive. The fastening elements 5 are in electrically conductive contact with the electrically conductive layer 3 (see FIG. 4). The fastening elements 5 consist of a metal or comprise at least one metal. The fastening elements 5 may also comprise an insulation 17 at least in a sub-region, as will be explained in greater detail in connection with FIG. 6.

The fastening elements 5 are introduced partly into the openings 8. If the fastening element 5 is a screw, the respective opening 8 may comprise a screw thread (not shown explicitly). The fastening elements 5 pass completely through the respective opening 8 and thus the carrier 2.

The fastening elements 5 each comprise a first end region 5A and a second end region 5B. The first end region 5A projects out of the carrier 2 at the surface facing the semiconductor chip 4 (see in particular FIG. 2). The second end region 5B projects out of the carrier 2 at the surface remote from the semiconductor chip 4 (see in particular FIG. 2) and into the holder 11 (see FIGS. 1, 5 and 6). To this end, the holder 11 may comprise corresponding openings (see FIG. 6). In particular, the second end region 5B of the respective fastening element 5 is in electrical contact with the n-side or the p-side contact region 9, 10 of the holder 11, as soon as the fastening element 5 has reached an end position in respect of carrier 2 and holder 11 and the carrier 2 is thus fastened to the holder 11. The second end region 5B of the fastening element 5 is thereby connected electrically conductively to the respective contact region 9, 10, as is described in detail further below. The first end region 5A rests on the electrically conductive layer 3 and is consequently in electrically conductive contact with the electrically conductive layer 3.

The first end region 5A comprises a greater lateral extent or a greater diameter than the second end region 5B. In particular, the lateral extent of the first end region 5A is greater than the lateral extent of the opening 8 in which the fastening element 5 is partly introduced. Penetration of the first end region 5A into the opening 8 is thus prevented. The first end region 5A consequently limits movement of the fastening element 5 in the direction of the holder 11. As soon as a surface of the first end region 5A which faces the carrier 2 interacts with the surface of the carrier 2 or the electrically conductive layer 3, the fastening element 5 has reached the final position in respect of carrier 2 and holder 11. In particular, the surface of the first end region 5A facing the carrier 2 rests on the top of the carrier 2 and in particular on the electrically conductive layer 3 when the carrier 2 is connected with the holder 11 or fastened thereto. As a result of the first end region 5A resting directly on the electrically conductive layer 3, the semiconductor chip 4 is electrically connected with the holder 11.

The semiconductor chip 4 is connected electrically conductively with the holder 11 and in particular the contact regions 9, 10 by the fastening elements 5 and in particular the second end regions 5B. In contrast, no electrically conductive connection arises between the semiconductor chip 4 and the main body 20, which is electrically insulated from the contact regions 9, 10.

Via the n-side contact region 9, electric current may be impressed into the semiconductor chip 4 fastened to the carrier 2 via the fastening elements 5 and/or the second end region 5B, which projects into the n-side contact region 9. The electrically conductive layer 3 distributes the current impressed by the contact regions 9, 10 at the top of the carrier 2.

The electrically conductive layer 3 is connected electrically conductively in the above-mentioned n-conductive region 6 (see FIGS. 3 and 4) to the n-side contact region 9 via one of the two fastening elements 5 and in a p-conductive region 7 (see FIGS. 3 and 4) to the p-side contact region 10 via the other one of the two fastening elements 5.

Figure 3:
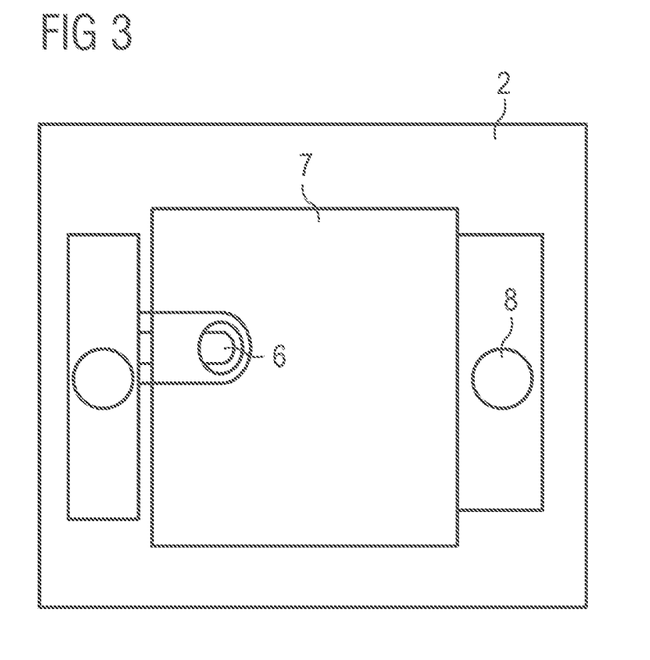
FIG. 3 shows a plan view onto part of the device from FIG. 1.
Figure 4:
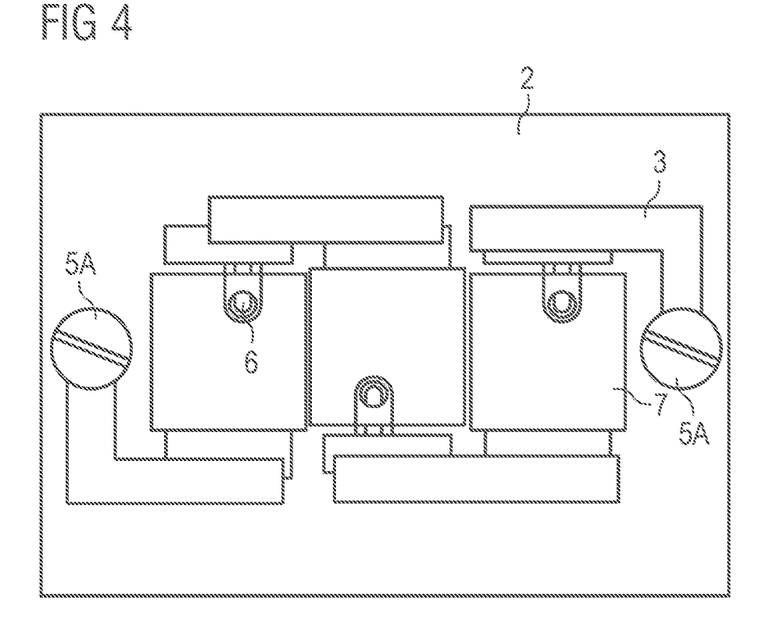
FIG. 4 shows a plan view onto part of the device from FIG. 1.

The n-conductive region 6 and the p-conductive region 7 of the electrically conductive layer 3 are electrically insulated from one another. The n-conductive region 6 may be enclosed by the p-conductive region 7. The n-conductive region 6 is of annular construction. In particular, the semiconductor chip 4 is connected electrically on the p-side via the p-conductive region 7, which is connected electrically conductively to the p-side contact region 10 via one of the fastening elements 5. The semiconductor chip 4 is connected on the n-side via the n-conductive region 6, which is connected electrically conductively to the n-side contact region 9 of the holder 11 via the other one of the fastening elements 5.

The electrically conductive layer 3 serves as a rewiring plane of the device 1. In particular, connection of the contact regions 9, 10 of the holder 11 to the p- or n-conductive regions 6, 7 respectively proceeds solely at the surface of the carrier 2 facing the semiconductor chip 4 via the electrically conductive layer 3, as is apparent in particular from FIG. 2 or 6 respectively. Further contacting of the semiconductor chip 4, for example, by means of wires, is superfluous.

Figure 5:
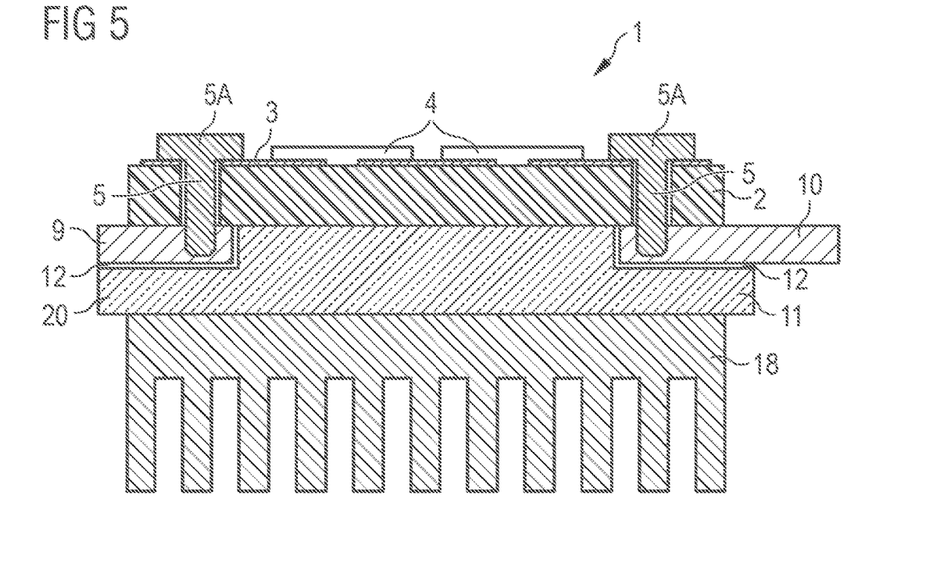
FIG. 5 shows a side view of an optoelectronic device according to a further exemplary embodiment.

FIG. 5 shows a side view of an optoelectronic device 1 according to a further exemplary embodiment. With regard to the general features of the device 1, extensive reference is made to the preceding description relating to FIGS. 1 to 4.

As in the exemplary embodiment shown in FIG. 1, the contact regions 9, 10 in this exemplary embodiment are again arranged on the surface of the holder 11 facing the carrier 2. However, the contact regions 9, 10 here do not extend over the entire vertical extent of the holder 11. Rather, the contact regions 9, 10 are mounted on the main body 20. To this end, the main body 20 comprises a recess in the region of the contact regions 9, 10, such that the vertical extent of the main body 20 in this region and the vertical extent of the respective contact region 9, 10 results in the total vertical extent of the holder 11. The respective recess is arranged at the surface of the holder 11 facing the carrier 2.

The contact regions 9, 10 are again electrically insulated from one another and from the main body 20 by means of the insulation 12. The second end regions 5B of the fastening means 5 project into the contact regions 9, 10 for electrical contacting of the semiconductor chip 4 and for mechanical fastening of the carrier 2 to the holder 11.

In addition, in this exemplary embodiment the device 1 comprises a heat sink 18. The heat sink 18 is fastened, for example, adhesively bonded, to a surface of the holder remote from the carrier 2. The heat sink 18 enlarges the heat-dissipating surface of the device 1 and thus guards against possible damage to the device 1 through overheating.

Figure 6:
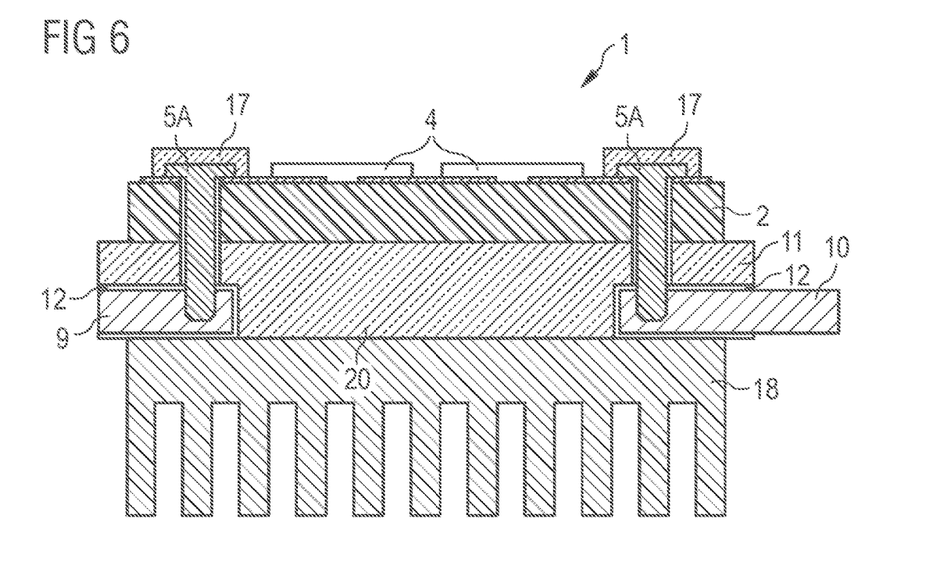
FIG. 6 shows a side view of an optoelectronic device according to a further exemplary embodiment.

FIG. 6 shows a side view of an optoelectronic device 1 according to a further exemplary embodiment. With regard to the general features of the device 1, extensive reference is made to the preceding description relating to FIGS. 1 to 5.

In contrast to the exemplary embodiments shown in FIGS. 1 and 5, the contact regions 9, 10 are arranged in this exemplary embodiment at the surface of the holder 11 remote from the carrier 2. In other words, the contact regions 9, 10 face the heat sink 18. The contact regions 9, 10 do not extend over the entire vertical extent of the holder 11. In particular, the contact regions 9, 10 are mounted on the main body 20. To this end, the main body 20 comprises a recess in the region of the contact regions 9, 10. The respective recess is arranged at the surface of the holder 11 remote from the carrier 2.

The contact regions 9, 10 are electrically insulated from one another and from the main body 20 by means of the insulation 12. In the region of the contact regions 9, 10 the fastening means 5 project through the main body 20 and into the contact regions 9, 10 for electrical contacting of the semiconductor chip 4 and for mechanical fastening of the carrier 2 to the holder 11. To this end, the holder 11, as described above, comprises corresponding openings for guiding the fastening means 5 at least partly through the holder 11.

In this exemplary embodiment the fastening means 5 additionally comprise an insulation 17. The insulation 17 is arranged in the first end region 5A of the respective fastening means 5. The insulation 17 may, for example, comprise a plastics cap, which is fastened in, for example, placed on, the first end region 5A.

The above-described optoelectronic device 1 is produced as follows:

In a first step, the above-described carrier 2 is provided. Thereafter, the openings 8 are formed in the carrier 2, for example, by drilling, punching and/or etching, such that the openings 8 pass completely through the carrier 2. In particular, the openings pass completely through the carrier 2 in a vertical direction, as is apparent, for example, from FIGS. 1, 5 and 6. Alternatively, the openings 8 may be introduced during production of the carrier 2, while it is still in the green state, and in particular prior to firing of the carrier 2.

The openings 8 are formed in edge regions of the carrier 2 (see FIGS. 1, 5, 6 and 7A to 7C). The openings 8 may merge with the edge region of the carrier 2, as is apparent from FIGS. 7B and 7C. In particular, the openings 8 may constitute notches, indentations or slots in the edge region of the carrier 2 (see FIGS. 7B and 7C). In this way, the fastening elements 5 may be introduced into the openings 8 later from the broadside of the device (i.e., from the horizontal direction).

In a further step, the top of the carrier 2 is provided with the electrically conductive layer 3. In particular, the carrier 2 is coated at least in part with the electrically conductive layer 3. The electrically conductive layer 3 is formed in particular in a region between the openings 8 and around the openings 8. In particular, a part of the electrically conductive layer 3 may lead away from an opening 8 into a region on which the semiconductor chip 4 is arranged in a subsequent step (see, for example, FIG. 4).

In a further step, the semiconductor chip 4 is mounted on the electrically conductive layer 3 by means of the bonding means layer 19. The semiconductor chip 4 is arranged between the openings 8.

In a further step, the carrier 2 is arranged on the holder 11. In this case, the carrier 2 is arranged in such a way on the holder 11 that the openings 8 in the carrier 2 are arranged over the contact regions 9, 10.

In a further step, the fastening elements 5 are provided. Then the carrier 2 is fastened to the holder 11. To this end, the fastening elements 5 are guided partly through the openings 8 in the carrier 2. In particular, in this exemplary embodiment the second end region 5B is passed into and through the respective opening 8 in the carrier, such that the second end region 5B then projects into the respective contact region 9, 10 of the holder 11. The first end region 5A then projects out of the carrier 2 at the surface of the carrier 2 remote from the holder 11. After fastening of the carrier 2, the first end region 5A is in mechanically and electrically conductive contact with the electrically conductive layer 3. The semiconductor chip 4 is electrically conductively connected with the holder 11 by means of the fastening elements 5.

In a further step, the growth substrate is removed from the surface of the semiconductor chip 4 remote from the carrier 2. The semiconductor chip 4 is then mechanically stabilized by means of the carrier 2 and the holder 11.

In a further, optional step, the surface of the semiconductor chip 4 remote from the carrier 2 is roughened or patterned.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic device comprising:
a carrier;
an electrically conductive layer with an n-conductive region and a p-conductive region arranged on the carrier;
at least one semiconductor chip comprising an active layer for generating electromagnetic radiation, wherein the semiconductor chip is electrically conductively and mechanically connected with the carrier via the electrically conductive layer; and
a holder comprising at least one n-side contact region, at least one p-side contact region and a main body,
wherein both the contact regions are electrically insulated from the main body and from another,
wherein the main body is in direct contact with the carrier,
wherein a surface of the carrier remote from the semiconductor chip is arranged on the holder,
wherein the carrier is mechanically connected with the holder by at least two fastening elements and is fastened to the holder,
wherein the fastening elements pass completely through the carrier, and
wherein the n-conductive region is electrically connected to the n-side contact region via a first fastening element and the p-conductive region is electrically connected to the p-side contact region via a second fastening element.

2. The device according to claim 1, wherein the device comprises a connection between the at least one semiconductor chip and the carrier, wherein the connection proceeds between spatially insulated contact regions of the same polarity of the device solely at the surface of the carrier facing the semiconductor chip.

3. The device according to claim 1, wherein the device comprises two or more fastening elements, wherein the carrier comprises openings, wherein the openings pass completely through the carrier, wherein the openings are electrically insulated from one another, and wherein the respective fastening element is introduced at least partly into the respective opening.

4. The device according to claim 1, wherein a first end region of the fastening element projects out of the carrier at a surface of the carrier remote from the holder, and wherein a second end region of the fastening element projects out of the carrier at a surface of the carrier facing the holder.

5. The device according to claim 4, wherein the second end region of the fastening element passes at least partly through the holder.

6. The device according to claim 5, wherein the holder comprises a contact region, into which the second end region of the fastening element projects.

7. The device according to claim 4, wherein the holder comprises at least one n-side contact region, at least one p-side contact region and a main body, wherein the n-side contact region and the p-side contact region are electrically insulated from the main body and from one another, and wherein the second end region of the fastening element is electrically conductively connected with the respective contact region.

8. The device according to claim 7, wherein the electrically conductive layer comprises an n-conductive region which is connected to the n-side contact region via the fastening element, wherein the electrically conductive layer comprises a p-conductive region which is connected to the p-side contact region via a further fastening element, and wherein the n-conductive region and the p-conductive region of the electrically conductive layer are electrically insulated from one another.

9. The device according to claim 1, wherein the fastening element comprises a screw, a nail, a retaining pin or a rivet.

10. The device according to claim 1, wherein the fastening element comprises an insulation at least in a sub-region.

11. The device according to claim 1, wherein the fastening element consists of a metal or comprises at least one metal.

12. The device according to claim 1, wherein the carrier contains a silicon nitride ceramic or consists thereof.

13. A method for producing the optoelectronic device according to claim 1, the method comprising:
providing the carrier with openings;
forming the electrically conductive layer on the carrier;
arranging the at least one semiconductor chip on the carrier, wherein the semiconductor chip is electrically conductively connected with the electrically conductive layer;
arranging the carrier on the holder; and
fastening the carrier on the holder with fastening elements for mechanical connection of the carrier to the holder and for electrical contacting of the semiconductor chip.

14. The method according to claim 13, wherein fastening the carrier on the holder comprises guiding the fastening elements through the openings.

15. The method according to claim 13, further comprising removing a growth substrate from a surface of the semiconductor chip remote from the carrier.

16. A headlamp comprising:
an optoelectronic device according to claim 1; and
an optical element arranged downstream of the optoelectronic device in an emission direction.

17. The device according to claim 1, wherein a surface of the holder facing the carrier is of convex construction thereby providing thermal coupling to the carrier through pretension.

18. The device according to claim 1, wherein the holder comprises a metal, and wherein the holder is a heat sink for the device.

19. An optoelectronic device comprising:
a carrier;
an electrically conductive layer with an n-conductive region and a p-conductive region arranged on the carrier;
at least one semiconductor chip comprising an active layer for generating electromagnetic radiation, wherein the semiconductor chip is electrically conductively and mechanically connected with the carrier via the electrically conductive layer; and
a holder comprising at least one n-side contact region, at least one p-side contact region and a main body,
wherein both the contact regions are electrically insulated from the main body and from another,
wherein the main body is arranged between the contact regions and mechanically connects the contact regions,
wherein the main body is in direct contact with the carrier so that there is no gap between the main body and the carrier,
wherein a surface of the carrier remote from the semiconductor chip is arranged on the holder,
wherein the carrier is mechanically connected with the holder by at least two fastening elements and is fastened to the holder,
wherein the fastening elements pass completely through the carrier, and
wherein the n-conductive region is electrically connected to the n-side contact region via a first fastening element and the p-conductive region is electrically connected to the p-side contact region via a second fastening element.

20. The device according to claim 19, wherein a surface of the holder facing the carrier is of convex construction.

21. The device according to claim 20, wherein the holder comprises a metal, and wherein the holder is a heat sink for the device.

* * * * *